(12) United States Patent
Froehlich et al.

(10) Patent No.: US 7,251,016 B2
(45) Date of Patent: Jul. 31, 2007

(54) METHOD FOR CORRECTING STRUCTURE-SIZE-DEPENDENT POSITIONING ERRORS IN PHOTOLITHOGRAPHY

(75) Inventors: Hans-Georg Froehlich, Dresden (DE); Manuel Vorwerk, Dresden (DE); Ansgar Teipel, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 11/190,056

(22) Filed: Jul. 27, 2005

(65) Prior Publication Data
US 2006/0023198 A1  Feb. 2, 2006

(30) Foreign Application Priority Data
Jul. 30, 2004  (DE) .............. 10 2004 037 018
Dec. 30, 2004  (DE) .............. 10 2004 063 522

(51) Int. Cl.
G03B 27/68 (2006.01)
(52) U.S. Cl. ............................................. 355/52
(58) Field of Classification Search ............. 355/52, 355/53, 55; 430/311; 356/400, 401
See application file for complete search history.

(56) References Cited

U.S. PATENT DOCUMENTS

| 2002/0183989 A1 | 12/2002 | Chien et al. |
| 2003/0202174 A1 | 10/2003 | Smith et al. |
| 2003/0223630 A1* | 12/2003 | Adel et al. .................. 382/145 |

* cited by examiner

Primary Examiner—Henry Hung Nguyen
Assistant Examiner—Chia-how Michael Liu
(74) Attorney, Agent, or Firm—Edell, Shapiro & Finnan, LLC

(57) ABSTRACT

A method for correcting structure-size-dependent positioning errors during the photolithographic projection by an exposure apparatus and the use thereof includes providing an exposure apparatus for exposing a plurality of exposure fields and a simulation model of the exposure apparatus for specifying correction values for intra-field errors, providing a first pattern with first structure elements and first measurement marks, which, in the case of a projection, are beset by a first positioning error and a second positioning error dependent on the dimensions and the position in the exposure field, providing a correction function suitable for specifying the first and the second positioning error, determining an average relative positioning error including the first and the second positioning error, calculating correction values for the control of the exposure apparatus, and transmitting the correction values to the exposure apparatus so that subsequent exposures are performed with an improved overlay.

40 Claims, 6 Drawing Sheets

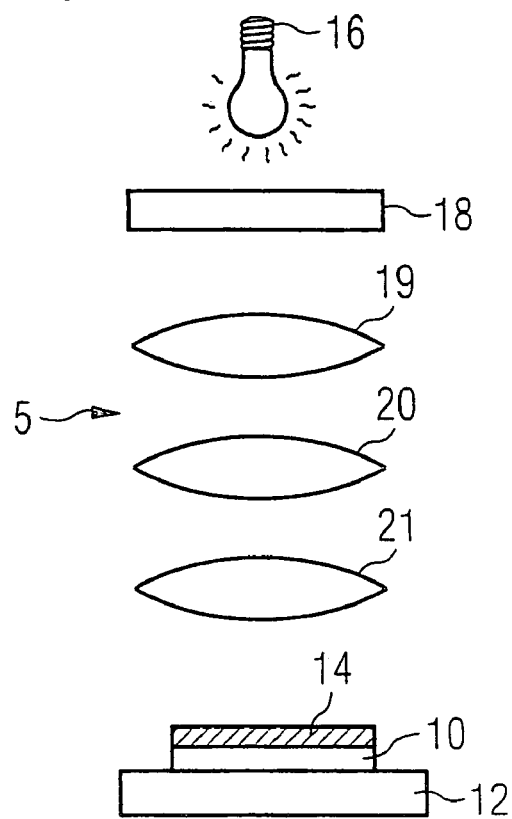
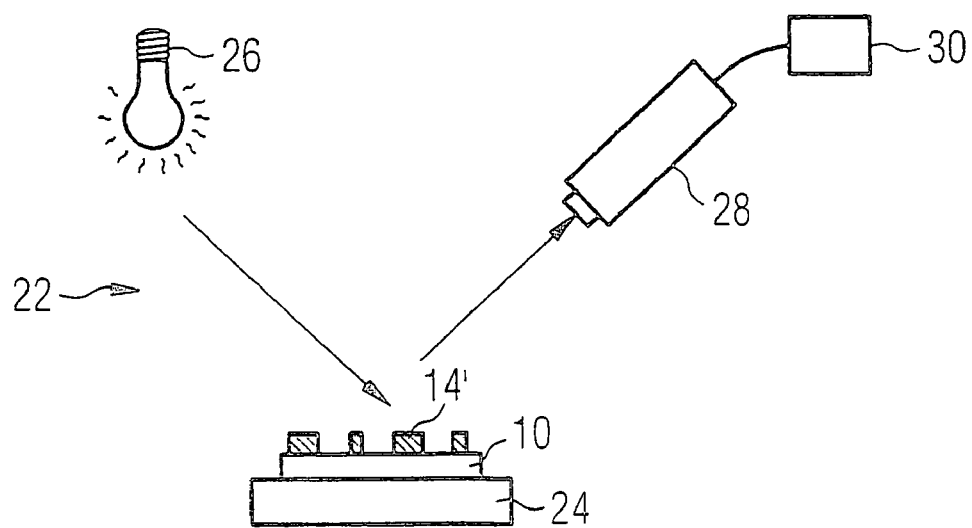

METHOD FOR CORRECTING STRUCTURE-SIZE-DEPENDENT POSITIONING ERRORS IN PHOTOLITHOGRAPHY

CROSS-REFERENCE TO RELATED APPLICATIONS

This application claims priority under 35 U.S.C. §119 to German Application No. DE 10 2004 037018.4, filed on Jul. 30, 2004, and titled "Method for the Correction of Structure-Size-Dependent Positioning Errors During the Photolithographic Projection by Means of an Exposure Apparatus and the Use Thereof," and to German Application No. 102004063522.6, filed on Dec. 30, 2004, and titled "Method for the Correction of Structure-Size-Dependent Positioning Errors During the Photolithographic Projection by Means of an Exposure Apparatus and the Use Thereof," the entire contents of each are hereby incorporated by reference.

FIELD OF THE INVENTION

This invention relates to a method for the correction of structure-size-dependent positioning errors during the photolithographic projection by an exposure apparatus, and to using such a method for lithographic patterning of a semiconductor wafer.

BACKGROUND

In order to fabricate integrated circuits, layers provided with different electrical properties are usually applied to semiconductor wafers and patterned lithographically. A lithographic patterning may include applying a photosensitive resist, exposing the resist with a desired structure for the relevant layer, developing the resist, and subsequently transferring the resist mask thus produced into the underlying layer in an etching step.

As the integration densities of integrated circuits continuously increase, positional accuracy requirements of a structure to be projected onto the semiconductor substrate also increase. When preliminary layers have already been transferred in underlying layers, e.g., in a lithographic projection step, it is necessary to account for stricter tolerance limits with regard to the mutual orientation of the structure to be projected onto the substrate relative to the structures of the aforementioned preliminary layers to ensure functionality of the circuit.

Dense line-space patterns are formed, for instance, in the area of fabrication of dynamic random access memories (DRAM) with line widths of 70, 90, or 110 nm, for example, in the region of the first circuit layers. In modem technologies for DRAM fabrication, the accuracy required for the orientation of two structures, also referred to as the overlay budget, will decrease due to decreasing structure resolutions. Thus, for example, the tolerable positional inaccuracy is only approximately 20 nm in the case of the 100 nm process line. Current and future process lines are thus sensitive to errors in the positional accuracy.

For the lithographic projection step, which may be performed, e.g., in a wafer stepper or scanner, alignment sequences are therefore provided before the beginning of the respective exposures. The alignment marks are typically arranged in the edge regions of the masks providing the relevant structure. During the exposure, the alignment marks are transferred in the sawing frame separating the individual exposure fields on the wafer. The alignment marks make it possible to determine the position of the structures formed on the wafer, or, as a result of determining the position of the alignment marks, possible to deduce the accurate positioning and orientation of the structure for the integrated circuit.

The exposure of the individual exposure fields is usually performed such that the top side of the semiconductor wafer is subdivided into a pattern of exposure fields in the form of a matrix or grid and is successively exposed by the wafer scanner or the wafer stepper.

The positional accuracy of two layers lying one above the other is normally determined by overlay targets during the production of integrated circuits. The targets are two partial structures each imaged separately onto each of the layers. The first partial structure may comprise a rectangular structure element surrounded by a frame-type second partial structure. Overlay targets are usually arranged together with other alignment marks in the sawing frame region. The structure described above is known as a box-in-box mark or a box-in-frame mark. The offset of the individual partial structures with respect to one another is usually measured by an overlay measuring apparatus, for example, an optical microscope.

In the exposure of a semiconductor wafer by a wafer scanner, a number og effects may lead to overlay errors. These overlay errors can generally be assigned to two categories of error sources. First, errors may occur which arise during the exposure within an exposure field. These error sources are usually referred to as intra-field error or field error. Second, error sources may be caused by the division of the semiconductor wafer into individual exposure fields and may be different for each exposure field. These error sources are usually referred to as inter-field error or grid error.

The orientation or alignment of the substrate in the exposure apparatus with respect to the projection optical arrangement (i.e., the projection lenses, the respective mask to be projected, apertures, and the illumination source, etc.) is carried out by comparing the alignment marks with reference marks. Such reference marks are often inserted by the lens system with respect to a detector.

The way the alignment method (alignment or overlay) is specifically carried out depends on the apparatus manufacturers. Based on the mark comparison, an offset between the actual alignment mark position and the ideal position of the reference mark is ascertained, modeled, and corrected.

A problem to which little consideration has been given hitherto is the degree of positional accuracy of different structure pattern portions, which can be attained differently within an exposure field. Reasons for this are, in particular, lens imaging errors such as, for example, the distortions called coma, three-leaf clover, astigmatism, etc., which are generally referred to as aberration errors.

One problematic effect is that the size of the imaging error of a structure is dependent on the respective form, orientation, and size of the structure. Thus, for example, dense line-space structures with very small structure dimensions are provided with a different offset with respect to an ideal position in an exposure with a perfect lens than, for example, the alignment marks that generally have very large dimensions.

In such cases, the above-mentioned deduction of the positions of the respectively imaged structures from the position determined for the alignment mark during the alignment and the determination of the overlay may be erroneous. This holds true as the structures or structure elements differ from the alignment marks in size, form, and orientation.

In the area of the alignment methods, i.e., in the case of the alignment or overlay of a wafer in the exposure apparatus, overlay measurement marks with a microstructure are known. The microstructure is provided with structure elements representing the semiconductor component of this layer. The overlay measurement marks are thus subject to a different imaging error due to lens distortions than hitherto customary box-in-box or box-in-frame measurement marks. The exposure position determined by alignment mark comparison during the alignment of a substrate subsequently exposed is corrected such that the structures of the individual layers, instead of the overlay measurement marks, are imaged on one another with higher accuracy.

In this case, however, it proves disadvantageous for a determination of the positional accuracy error by the micro-patterned measurement marks for different structures. It is necessary to provide special measurement marks which permit a determination of the overlay or of the positional inaccuracies for the two layers lying one above the other. As a result, the determination of the positional inaccuracies for all layers of the integrated circuit, particularly in an evaluation of a new process line, is very time-consuming. In conventional measuring apparatuses, the frequently changing patterning are associated with varying contrast or intensity conditions, which impedes the measurability of the micro-patterned measurement marks.

Therefore, a method for an integrated circuit with one or a plurality of layers that enable a simple correction of the structure-dependent positioning errors for each layer is desirable.

SUMMARY

A method for correcting structure-size-dependent positioning errors during the photolithographic projection by an exposure apparatus includes providing an exposure apparatus for performing an exposure in a plurality of exposure fields, providing a simulation model of the exposure apparatus, providing a first pattern having a plurality of first structure elements and a plurality of first measurement marks, photolithographically projecting the first pattern by the exposure apparatus into the exposure fields, providing a correction function for specifying the first positioning error and the second positioning error, determining an average relative positioning error including the first positioning error and the second positioning error, calculating correction values for the control of the exposure apparatus based on the first positioning error and the second positioning error by the simulation model, and transmitting the correction values to the exposure apparatus, so that subsequent exposures are performed with an improved overlay. The simulation model includes a calculation specification and specifies correction values for intra-field errors during the exposure. In the case of projection by the exposure apparatus, the first structure elements are beset by a first positioning error depending on the dimensions of the first structure elements and the position of the first structure elements in the exposure field. The first measurement marks are beset by a second positioning error depending on the dimensions of the first measurement marks and the position of the first measurement marks in the exposure field. Different positioning errors are brought about for the first structure elements and first measurement marks due to different dimensions as a result of aberration.

In the present invention, error contributions are determined by structure-size-dependent positioning errors, which have the same value in each exposure field, between the structure elements and the measurement marks. While conventional overlay inspection methods primarily optimize the position of the measurement marks of different layers, according to the invention the structure-size-dependent positioning error (referred to hereinafter as positioning error) of the positionally critical structure elements and the positioning error of the measurement marks are determined individually and independently of one another. The relative positioning error is returned to the exposure apparatus as an additional intra-field error, so that this contribution is corrected in subsequent exposures. The relative positioning error is principally caused by a projection lens of the exposure apparatus and has an identical value given identical exposure conditions for each exposure field. Consequently, the method according to the invention can be carried out once up to a possible change in the exposure conditions. The calculated correction values are transmitted to the exposure apparatus and bring about a correction of the lens-induced errors.

In a further embodiment, providing the first pattern includes the first structure elements having minimal dimensions of 100 nm or less.

Modern production processes have minimal structure dimensions of less than 100 nm. These critical dimensions are different from the dimensions usually used for measurement marks, so that the invention can correct the structure-size-dependent positioning errors particularly in modern technologies with very small dimensions.

In a further embodiment, providing the first pattern includes the first measurement marks having minimal dimensions of between 0.5 µm and 5 µm and form the first part of an overlay target.

Overlay targets often include box-in-box or box-in-frame structures detected and measured by an optical microscope. The dimensions of the measurement marks forming the overlay target are usually chosen in the region of a few micrometers, which enables a simple detection and does not cause an excessively large area requirement. Due to different dimensions with respect to the first structure elements, however, the first positioning error and the second positioning error are different.

In a further embodiment, providing the first pattern includes providing a sawing frame surrounding the first pattern, and providing the plurality of first measurement marks arranged such that a respective first measurement mark lies in the region of each corner of the sawing frame.

Overlay targets are often accommodated in the sawing frame region and, particularly, in the region of each corner of the sawing frame around the first pattern, which represents, for example, an integrated circuit to be fabricated. In accordance with this procedure, there is no need to reserve any area in the region of the first pattern, i.e., for example, in the region of the active chip area, for the measurement marks.

In a further embodiment, providing the first pattern furthermore includes providing the plurality of first measurement marks arranged such that at least one first measurement mark lies in the region of the midpoint of the exposure field.

To be precise about the size of the positioning error within an exposure field, at least one measurement mark is arranged within the exposure field. In accordance with this procedure, the first and second positioning errors that depend on the position within the exposure field can be determined with greater accuracy.

In a further embodiment, providing the correction function includes providing a test substrate with a resist layer on the front side, providing a first test mask with a first test pattern with a first multiple arrangement of a first test structure, transferring the first test pattern by photolithographic projection into the resist layer of the test substrate, and determining the values of the first positioning error of the first pattern relative to the at least one first measurement mark and the at least one first micro-patterned alignment mark for each element of the first multiple arrangement. The first test structure includes parts of the first pattern, the plurality of first measurement marks, and at least one first micro-patterned alignment mark.

In accordance with this procedure, the first and second positioning errors are determined relative to a micro-patterned alignment mark. This determination may be effected for a plurality of positions on the exposure field, so that the first and second positioning errors can be determined with great accuracy within the exposure field. The multiple arrangement with the first test structure can be measured in a simple manner since, in particular, there is no need to take into consideration the electrically functional circuit that is actually to be formed. The test structure is optimized with regard to relatively simple measurability and permits relatively accurate and precise determination of the first and second positioning errors.

In a further embodiment, the exposure apparatus is a wafer scanner. An exposure apparatus has good resolution, particularly in the patterning of layers with a high structure resolution, and thus be used for the correction of structure-size-dependent positioning errors of very critical layers. During the exposure of the test substrate, the exposure apparatus is operated with the same exposure conditions, so that the structure-size-dependent positioning errors are identical.

In a further embodiment, the multiple arrangement of the first test structure is arranged in column-type fashion, so that when the test structure is transferred into the resist layer of the test substrate by the wafer scanner, the first positioning errors and the second positioning errors and the relative positioning errors of the test structure are determined along an exposure slit of the wafer scanner.

In accordance with this procedure, the multiple arrangement of the first test structure along the exposure slit of the wafer scanner becomes possible. The dimensions of the test structure can be relatively smaller than those of the first pattern. Consequently, the exposure field is covered by the multiple arrangement during projection of the first pattern. The first positioning errors and the second positioning errors are determined over the entire exposure field. This results in a simple determination of the first and second positioning errors for different dimensions of the first pattern.

In a further embodiment, the multiple arrangement of the first test structure is arranged in matrix-type fashion, so that when the test structure is transferred into the resist layer of the test substrate by the wafer stepper, the first positioning errors and the second positioning errors of the test structure are determined in the imaging region of the wafer stepper. The first test structure is arranged in a partial field of the entire exposure field of the wafer stepper. The dimensions of the test structure can be selected relatively smaller than those of the first pattern. Consequently, the exposure field is covered by the multiple arrangement during projection of the first pattern and the first positioning errors and the second positioning errors are determined over the entire exposure field. This results in a simple determination of the first and second positioning errors for different dimensions of the first pattern.

In a further embodiment, the first micro-patterned alignment mark is formed with a plurality of microstructure elements, so that the patterning of the first micro-patterned alignment mark corresponds to the patterning of the first pattern. The micro-patterned alignment mark thus has the same structure-size-dependent positioning error as the first structure elements.

Since the size of the positioning errors and the dimensions of the first structure elements are often of the same order of magnitude, a very densely packed structure can be measured only with difficulty, particularly when a scanning electron microscope is used, since assignment errors can occur in the densely packed field of the structure elements. To avoid this problem, a micro-patterned measurement mark is used.

In a further embodiment, providing the correction function includes providing a model of the photolithographic projection by the exposure apparatus. The model specifies the first positioning error and the second positioning error for a multiplicity of positions within the exposure field.

In lithography, models of the photolithographic projection by the exposure apparatus are often used, for example, to optimize the exposure conditions with regard to the resolution that can be achieved. According to the invention, this model is used to determine the first positioning errors and second positioning errors. This enables a simple determination of the correction function since already existing model calculations can continue to be used.

In a further embodiment, determining the average relative positioning error includes forming the difference between the first positioning error and the second positioning error for a plurality of positions within the exposure field, which are subsequently averaged.

The use of the correction values for the exposure apparatus usually effects a correction for the entire exposure field since different adaptations are not possible within the exposure field. The invention accounts for this by calculating an average value.

In a further embodiment, the method further includes providing a second pattern having a plurality of second structure elements and a plurality of second measurement marks for forming a respective overlay target with one of the first measurement marks of the first pattern, photolithographic projection of the second pattern by the exposure apparatus into the exposure fields, and determining offset values of the overlay targets. In the case of projection by the exposure apparatus, the second structure elements are beset by a third positioning error depending on the dimensions of the second structure elements and the position of the second structure elements in the exposure field. The second measurement marks are beset by a fourth positioning error depending on the dimensions of the second measurement marks and depending on the position of the second measurement marks in the exposure field. Different positioning errors are brought about for the second structure elements and second measurement marks due to different dimensions as a result of aberration. The offset value is composed of an overlay error, the first positioning error, the second positioning error, the third positioning error, and the fourth positioning error.

The present invention can extended to a plurality of layers with different patterns. The second pattern includes structure elements and a plurality of second measurement marks that form a respective overlay target with a first measurement mark of the first pattern. In addition to correcting the structure-dependent positioning errors of the first pattern and the first measurement marks, offset values are determined for the overlay targets. These offset values are corrected by contribution of the respective differences between the structure elements and the measurement marks. As a result, the structure-size-dependent positioning error of the first structure elements with respect to the second structure elements is improved, which leads to an improved overlay during the lithographic projection of the patterns.

In a further embodiment, providing the second pattern includes the second structure elements having minimal dimensions of 100 nm or less. As already mentioned above, modern production processes have minimal structure dimensions of less than 100 nm. These critical dimensions are different from the dimensions usually used for measurement marks, so that the invention can correct the structure-size-dependent positioning errors particularly in modern technologies with very small dimensions.

In a further embodiment, providing the correction function includes the correction function specifying the third positioning error and the fourth positioning error. The correction function is extended to the effect that the structure-size-dependent positioning errors of the second pattern are also specified. The invention can thus be extended in a simple manner to patterns having different minimal dimensions.

In a further embodiment, determining the offset value of the overlay target includes providing the first positioning errors as a function of the position on the exposure field, providing the third positioning errors as a function of the position on the exposure field, determining the difference between the first positioning error and the third positioning error as a function of the position on the exposure field, determining a first linear function that represents the first positioning error as a function of the position on the exposure field, determining a second linear function that represents the third positioning error as a function of the position on the exposure field, and determining further parameters for the simulation model. The further parameters are selected based on the first linear function and the second linear function such that the difference between the first positioning error and the third positioning error as a function of the position on the exposure field becomes minimal.

Usually, the positioning errors dependent on the position in the exposure field are described relatively accurately by a linear function. To improve the overlay of the first pattern and the second pattern, the difference between the first positioning error and the third positioning error is considered as a function of the position on the exposure field. This difference is minimized as the parameters of the simulation model for the exposure apparatus are derived from the first linear function and second linear function, and transmitted to the exposure apparatus. In the case of an exposure, the first and second patterns are optimized with regard to the overlay of the first and second structure elements and the overlay of the first and second measurement marks with respect to one another is not improved, in contrast to what has often been customary heretofore.

In a further embodiment, determining the offset value of the overlay target includes that the further parameters are allocated to a first contribution, which represents a further translation error, and a second contribution, which represents a further field rotation error, in the x direction and/or y direction.

It is often the case in the lithography of two patterns that only one direction is critical for the overlay. According to the invention, the further parameters of the simulation model can be specified in two directions. Since, the corrections are relatively identical for the exposure fields, the further parameters are allocated to a translation error or rotation error of the intra-field components of the calculation specification in order, in the case of an exposure, to improve the first and second patterns with regard to the overlay of the first and second structure elements.

In a further embodiment, determining further parameters for the simulation model includes transmitting the further parameters to the exposure apparatus, so that these parameters are implemented in subsequent exposures with an improved overlay.

The further parameters determined by the method according to the invention are often transmitted to the exposure apparatus by an Advanced Process Control (APC) control loop during fabrication of integrated circuits. The invention can thus be applied relatively cost-effectively in already existing production installations.

In a further aspect of the invention, a method for correcting structure-size-dependent positioning errors during the photolithographic projection by an exposure apparatus includes providing an exposure apparatus suitable for performing an exposure in a plurality of exposure fields, providing one or more movable lens elements in the projection objective of the exposure apparatus, in order to correct imaging properties of the exposure apparatus, providing a simulation model of the exposure apparatus, providing a first pattern having a plurality of first structure elements, providing a correction function for specifying the first positioning error, providing an at least second-order polynomial having a plurality of parameters, adapting the parameters of the polynomial in order to represent the first positioning error as a function of the position on the exposure field, calculating first correction values for control of the exposure apparatus based on the parameters characterizing the linear portion of the polynomial by the simulation model, calculating second correction values for the control of the exposure apparatus based on the parameters characterizing the nonlinear portion of the polynomial by the simulation model, transmitting the first correction values to the exposure apparatus, and transmitting the second correction values to the movable lens elements of the exposure apparatus, so that subsequent exposures are performed with an improved overlay. The simulation model includes a calculation specification and specifies correction values for intra-field errors during the exposure. In the case of projection by the exposure apparatus, the first structure elements are beset by a first positioning error depending on the dimensions of the first structure elements and the position of the first structure elements in the exposure field.

In accordance with this procedure, the positioning errors induced by aberration errors based on the nonlinear corrections are improved. The first positioning error is minimized by the nonlinear corrections, which can be performed by the movable lens elements of the projection apparatus.

A method of using the invention for the lithographic patterning of a semiconductor wafer further includes providing the semiconductor wafer, transferring the first pattern by the exposure apparatus by photolithographic projection into a first layer, and transferring the second pattern by the exposure apparatus by photolithographic projection into a second layer. The further parameters are transmitted to the exposure apparatus, so that these are implemented in subsequent exposures with an improved overlay. The overlay of two layers with respect to one another can be improved, which leads to improved product yield in the fabrication of integrated circuits.

BRIEF DESCRIPTION OF THE DRAWINGS

The invention will now be explained in more detail with reference to the accompanying drawings, in which:

FIG. 1 is a schematic cross-sectional view of an exposure apparatus for applying the method according to the invention;

FIG. 2 is a schematic cross-sectional view of an overlay measuring apparatus for applying the method according to the invention;

DETAILED DESCRIPTION

Figure 3:
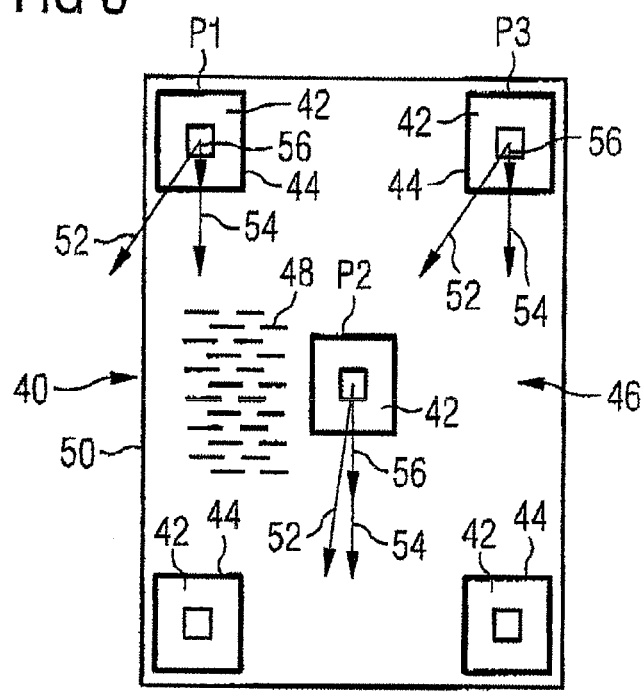
FIG. 3 is a schematic plan view of the front side of a semiconductor wafer during application of the method according to the invention.

A method for an exposure in an exposure field of a first and a second layer using a wafer scanner during fabrication of random access memory components (DRAM) can also be applied to a plurality of circuit layers with different exposure apparatuses. Also, the method can be used in the lithographic patterning of layers of other semiconductor components, for example, in the fabrication of logic circuits or the like.

FIG. 1 shows the construction of an exposure apparatus or projection apparatus 5 in a schematic cross-sectional view. The projection apparatus 5 includes a movable substrate holder 12. A semiconductor wafer 10 is placed on the substrate holder 12. A resist layer 14 is applied to the wafer on a front side, for example, by spinning-on.

The projection apparatus 5 further includes a light source 16 arranged above the substrate holder 12 for emitting light, for example, having a wavelength of 248 nm, 193 nm, or 157 nm. The light emitted by the light source 16 is projected through a projection objective 20 onto the surface of the semiconductor wafer 10.

A reticle 18 provided with a first pattern of a circuit layer is fitted between the light source 16 and the projection objective 20. In the case of a wafer scanner, an exposure slit is fitted between the reticle 18 and the projection objective 20 (not shown in FIG. 1). Through control of the substrate holder 12, the front side of the semiconductor wafer 10 is progressively patterned in individual exposure fields.

For the pattern, for example, a circuit design of a dynamic semiconductor memory having memory cells with trench capacitors of minimal dimensions of 100 nm or less in the region of the trench capacitors is provided.

As shown in FIG. 1, the projection objective 20 of the projection apparatus 5 includes a plurality of further elements. A first lens element 19 and a second lens element 21 are illustrated, for example, in FIG. 1. The first lens element 19 and the second lens element 21 are fitted, e.g., in the beam path between the reticle 18 and the semiconductor wafer 10 above and respectively below the projection objective 20. The first lens element 19 and the second lens element 21 correct imaging errors of the lens of the projection objective 20.

As mentioned in the introduction, several types of distortions that lead to imaging errors are known. The exposure apparatus manufacturers attempt to correct the distortions of the lens of the projection objective 20 by various correction elements to minimize aberration errors for a specific type of exposure, for example, annular exposure or dipole exposure. The specific aberration error characterizing a specific exposure apparatus is measured, for example, by an interferometric phase measuring apparatus.

The measured aberration error normally depends on the position of the measurement point within the exposure field (in the case of a wafer stepper) or the exposure slit (in the case of a wafer scanner). This two-dimensional profile of the aberration error is usually described by the Zernike polynomials, which represent a mathematical model of the projection objective 20 based on the fact that the aberration function can be represented as a superposition of the Zernike polynomials. Each individual Zernike polynomial is assigned a polynomial with a specific ordinal number. The proportion of the aberration error made up by a specific order is usually represented by the Zernike coefficients.

Each Zernike coefficient thus corresponds to a specific order of the Zernike polynomial and can be assigned to a specific type of aberration error. Thus, for example, the Zernike polynomial with the ordinal number 4 represents the influence of lack of depth of focus. The Zernike polynomial with the ordinal number 6 represents astigmatism possibly present.

Generally, the first lens element 19 and the second lens element 21 are assigned optical transmission properties that can be altered by displacing the first lens element 19 and second lens element 21 such that specific nonlinear corrections of, for example, the second or third order can be performed.

FIG. 2 shows the construction of an overlay measuring apparatus 22 in a schematic cross-sectional view. After the photolithographic projection, the positional accuracy of the currently exposed layer relative to already existing layers is determined by the overlay measuring apparatus 22. For this purpose, the first pattern that has already been transferred into a layer or the substrate has been provided with measurement marks suitable for forming an overlay target together with measurement marks of a second pattern. The overlay measuring apparatus 22 includes a further substrate holder 24 suitable for receiving the semiconductor wafer 10.

A resist structure 14' is applied on the front side of the semiconductor wafer 10, the resist structure having arisen through development from the resist layer 14. The overlay measuring apparatus 22 furthermore includes a further light source 26 in order to irradiate the front side of the semiconductor wafer 10 with light. The light reflected from the front side of the semiconductor wafer 10 is detected in a microscope 28 connected to a processing means, for example, a processor 30.

Measurement data of overlay targets of the individual exposure fields are processed by the microscope 28 and the processor 30. The evaluated measurement results are subsequently transmitted to the projection apparatus 5. This is usually done by the automatic process control (APC loop) in order to carry out subsequent exposures with the aid of the evaluated measurement results with an improved overlay.

This forms the starting point for the method according to the invention. The text below describes a first embodiment of the invention, in which the measurement data of the overlay target for each layer are provided with a structure-size-dependent correction, which are transmitted to the projection apparatus 5 in the context of the APC loop.

The starting point is the reticle 18, which is provided with a first pattern 46. The first pattern 46 has a plurality of first structure elements 48 and a plurality of first measurement marks 44. As shown in FIG. 3, the first structure elements 48 of the first pattern 46 are surrounded by a rectangular sawing frame 50. The first measurement marks 44 are arranged in a corner and in the center of the sawing frame 50.

In the case of a projection by the exposure apparatus 5, the first structure elements 48 are beset by a first positioning error dependent on the dimensions of the first structure elements 48 and the position of the first structure elements 48 in the exposure field 40. However, the first positioning error is also dependent on the exposure conditions, for example, the type of illumination in the exposure apparatus 5. Thus, the dependence on the structure size normally changes in the event of a change from dipole, quad-pole, or annular exposure.

In the case of a projection, the first measurement marks 44 are beset by a second positioning error dependent on the dimensions of the first measurement marks 44, the position of the first measurement marks 44 in the exposure field, and the exposure conditions.

In FIG. 3, the offset values 52 are depicted, for example, for each of the overlay targets 42 designated by the position P1, P2, P3. The offset values can be decomposed into a component in the x direction and a component in the y direction. Each offset value 52 has an overlay error 54 and a relative positioning error 56. The overlay error 54 specifies the actual positional inaccuracy of a layer.

The relative positioning error 56 is caused by the structure-size-dependent incorrect positioning due to lens aberration and includes the difference between the first and second positioning errors. According to the invention, this contribution is reduced in order to achieve an improved overlay.

Figure 4:
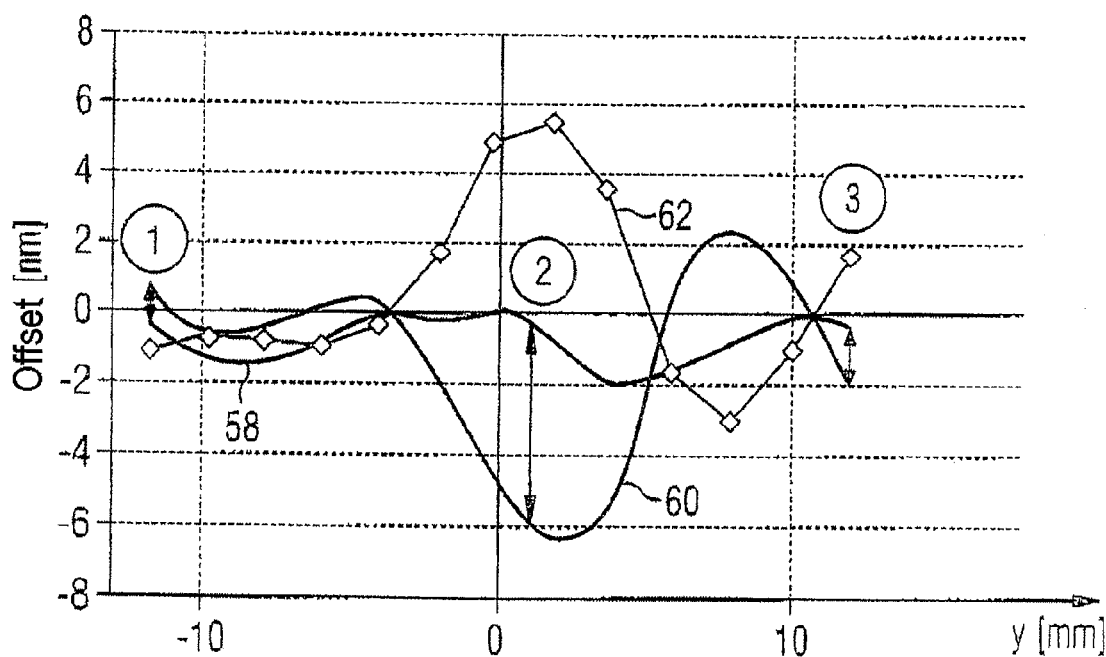
FIG. 4 is a schematic plan view of the front side of a semiconductor wafer with an exposure field during the application of the method according to the invention.

FIG. 4 shows the result of a simulation calculation of the first positioning errors 58 and second positioning errors 60, in which the first structure elements 42 have dimensions of approximately 100 nm. Box-in-box structures having external dimensions of approximately 50 µm and a line width of approximately 2 µm have been assumed for the first measurement marks 44. The photolithographic projection is effected by a wafer scanner as projection apparatus 5. The first positioning errors 58 and second positioning errors 60 are specified along an exposure slit of the wafer scanner.

Under the selected exposure conditions of the exposure apparatus 5, the first positioning error 58 and the second positioning error 60 deviate from one another by up to 6 nm. For illustration, the difference 62 between the first positioning error 58 and second positioning error 60 is likewise depicted in FIG. 4.

The simulation could be carried out, for example, using the ProLith simulator from the company KLA-Tencor or the simulator designated as Solid-C for photolithography from the company Sigma-C. Other simulation programs known to the person skilled in the art can likewise be used.

The result of the simulation calculation provides a correction function that specifies the first positioning error 58 and the second positioning error 60 as a function of the position along the exposure slit. An average relative positioning error is determined from the first positioning error 58 and the second positioning error 60, and specifies the difference between the first positioning error 58 and the second positioning error 60 in averaged fashion along the exposure slit. In the above example, the average relative positioning error would be approximately −3 nm.

This value of the average relative positioning error specifies the magnitude of the average incorrect positioning along the exposure slit that occurs during the determination of the position of the first measurement marks 44 relative to the first structure elements 42. In order to be able to correct this error during subsequent exposures, the value of the average relative positioning error is transmitted to the exposure apparatus 5 as intra-field correction.

A further possibility for determining the correction function is obtained by a test exposure of a test substrate with a test pattern comprising parts of the first pattern 46. After providing the test substrate with a resist layer on the front side, the test mask with the test pattern is introduced into the projection apparatus 5. The test pattern has a multiple arrangement of a first test structure. The first test structure includes the first pattern 46, the plurality of first measurement marks 44, and at least one first micro-patterned alignment mark. The test pattern is transferred into the resist layer of the test substrate by photolithographic projection. The values of the first positioning error 58 of the first pattern 46 relative to the first measurement marks 44 and the at least one first micro-patterned alignment mark are subsequently determined for each element of the first multiple arrangement.

If a wafer scanner is provided as the exposure apparatus 5, the multiple arrangement of the first test structure is preferably arranged in column-type fashion, so that when the test structure is transferred into the resist layer of the test substrate, the first positioning errors 58, and the second positioning errors 60 of the test structure from which the relative positioning errors are calculated are determined along the exposure slit of the wafer scanner.

If a wafer stepper is provided as the exposure apparatus 5, the multiple arrangement of the first test structure is preferably arranged in matrix-type fashion, so that when the test structure is transferred into the resist layer of the test substrate by the wafer stepper, the first positioning errors 58 and the second positioning errors 60 of the test structure can be determined in the imaging region of the wafer stepper.

The first micro-patterned alignment mark is formed with a plurality of microstructure elements, so that the patterning of the first micro-patterned alignment mark corresponds to the patterning of the first structure elements 48 of the first pattern 46. As a result, the first micro-patterned alignment mark has the same aberration error as the first structure elements 48.

The correction of the first positioning errors 58 and of the second positioning errors 60 is performed in particular for each critical layer of the semiconductor wafer prior to the photolithographic projection. The method according to the invention is performed for the layers having minimal structure dimensions in the vicinity of the resolution limit of the projection apparatus 5 and small overlay tolerances with respect to overlying or underlying layers. An improved overlay of different layers of a semiconductor wafer is produced overall.

As is explained below, the overlay of different layers of a semiconductor wafer can be improved, if the positioning errors induced by aberration are optimized not only for each layer individually, but rather in each case together, e.g., in pairs, for layers that are critical with regard to the overlay.

The starting point of this further embodiment of the invention is a second pattern, which is patterned with improved overlay above the first pattern 46 into a layer of the semiconductor wafer in the case of photolithographic projection. The second pattern has a plurality of second structure elements and a plurality of second measurement marks for forming the respective overlay target 42 with one of the first measurement marks of the first pattern. In the case of projection by the exposure apparatus, the second structure elements are beset by a third positioning error depending on the dimensions of the second structure elements and the position of the second structure elements in the exposure field. The second structure elements have, for example, minimal dimensions of 100 nm or less.

In the case of a projection, the second measurement marks are beset by a fourth positioning error dependent on the dimensions of the second measurement marks and dependent on the position of the second measurement marks in the exposure field. The second measurement marks are provided, for example, in the form of a frame having an external dimension of approximately 50 µm and a line width of 2 µm. The second pattern is surrounded by a further sawing frame. The second measurement marks are arranged such that a second measurement mark lies in the region of the corner of the further sawing frame. A second measurement mark may also be arranged in the region of the midpoint of the further sawing frame.

After the photolithographic patterning, offset values of the overlay targets are determined by the overlay measuring apparatus 22. The offset value includes an overlay error, the first positioning error 58, the second positioning error 60, the third positioning error, and the fourth positioning error.

The correction function discussed in connection with the first exemplary embodiment is modified for specifying the third positioning error and the fourth positioning error.

This may be effected, as already explained above, either by a simulation of the photolithographic projection. The simulation is carried out with the dimensions of the second structure elements and the second measurement marks.

A further test substrate and a further test mask can be provided to determine the third positioning errors and the fourth positioning errors on the basis of a test exposure. In this case, the dimensions of the pattern on the further test mask correspond to the dimensions of the second structure elements and the second measurement marks.

To improve the overlay of the offset value of the overlay targets 44, the first positioning error 58 is provided as a function of the position on the exposure field, as explained above, either by a simulation calculation or exposure of a test substrate.

Figure 5:
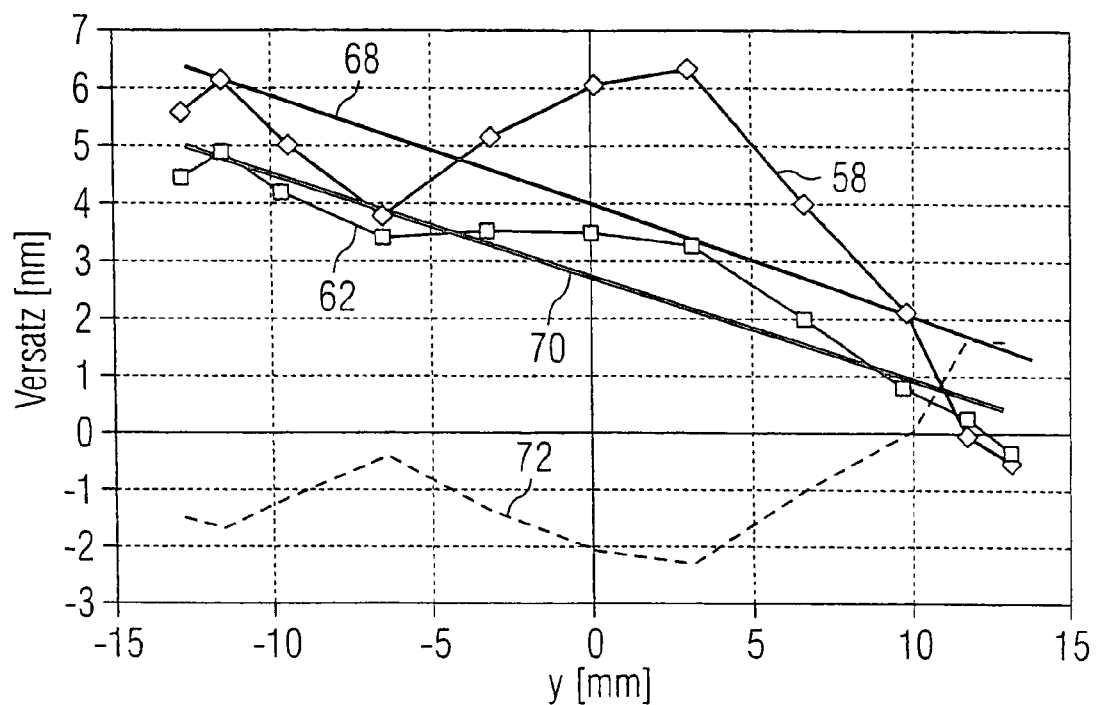
FIG. 5 diagrammatically illustrates offset values determined during application of the method according to the invention.

FIG. 5 shows the first positioning error 58 along a coordinate direction. As shown in FIG. 5, the third positioning error 64 is then provided as a function of the position on the exposure field and the difference 72 between the first positioning error 58 and the third positioning error 64 as a function of the position on the exposure field is plotted as a further curve.

Figure 6:
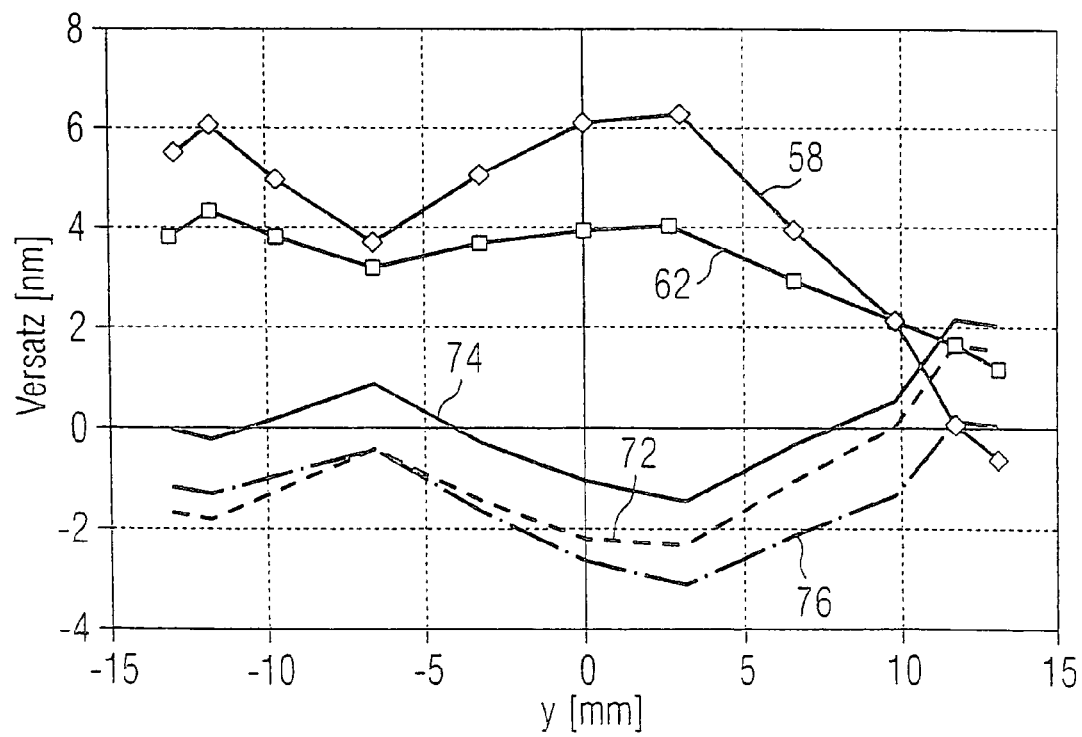
FIG. 6 diagrammatically illustrates offset values determined during application of the method according to the invention.

Instead of the above-explained averaging of the first positioning error 58 over the exposure field or, in the case where a wafer scanner is used, the exposure slit, a first linear function is determined hereinafter, which represents the first positioning error as a function of the position on the exposure field. As shown in FIG. 6, the first positioning error 58 follows a profile which can be approximated by the first linear function with sufficient accuracy. The first linear function 68 is likewise depicted in FIG. 5.

A second linear function 70 is subsequently determined, which, analogously to the first linear function 68, represents the third positioning error 64 as a function of the position on the exposure field. The second linear function 68 is shown in FIG. 6.

The first linear function 68 and the second linear function 70 are used hereinafter for determining further parameters for the simulation model. The further parameters chosen based on the first linear function 68 and the second linear function 70 such that the difference 72 between the first positioning error 58 and the third positioning error 62 as a function of the position on the exposure field becomes minimal.

The further parameters are allocated to a first contribution, which represents a further translation error, and a second contribution, which represents a further field rotation error, and are determined separately in a first direction and a second direction (y direction) arranged relatively perpendicular to the first direction (e.g., x direction). The layers of an integrated circuit that are critical for the overlay are often sensitive to overlay errors only in one direction, so that division into two directions facilitates the evaluation of the offset values 52. For each layer, the first positioning error is corrected using a linear function F(y), $$F(y)=a+b*y.$$

The linear function is adapted to the profile of the first and second positioning errors along the position y of the exposure slit in order to determine the free parameters thereof, namely the gradient b and the constant term a. The two parameters are returned as intra-field errors to the exposure apparatus by an APC loop. The first parameter a corresponds to the field magnification error and the second parameter b corresponds to the translation error of the overlay model.

These parameters of the simulation model are transmitted to the exposure apparatus 5 for each layer, so that, in the case of subsequent exposures, these are implemented with an improved overlay. The result of this procedure is shown in FIG. 6.

FIG. 6 shows, in addition to the first positioning error 58 and the third positioning error 62, the improved overlay between the first structure elements and second structure elements as curve 74. For comparison, a conventional correction of the overlay targets, in the case of which structure-size-dependent positioning errors are not taken into consideration, is plotted as further curve 76. The improvement amounts to approximately 55% averaged over the exposure slit, which results in a significantly higher product yield particularly in the production of integrated circuits.

As is explained below, a further improvement of the positioning error can be achieved using the first correction lens elements 19 and the second correction lens elements 21 of the exposure apparatus 5. This is important particularly when exposure conditions of the projection apparatus 5 bring about nonlinear aberration errors along the exposure slit which in turn lead to nonlinear structure-size-dependent positioning errors of the structure elements or measurement marks.

Figure 7A:
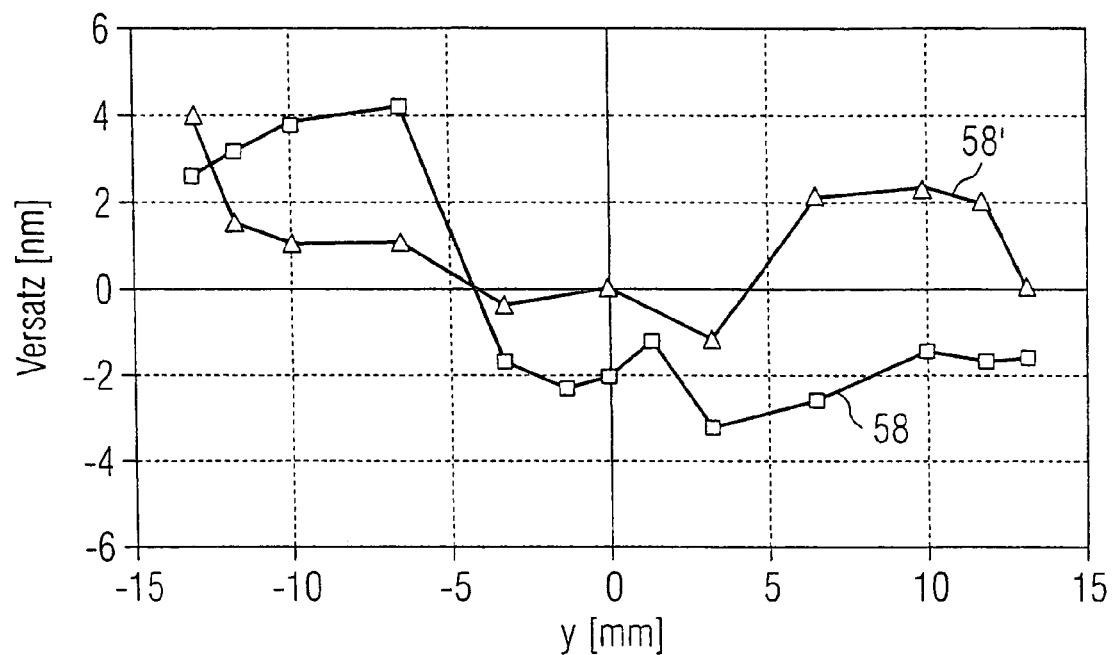
FIGS. 7A and 7B diagrammatically illustrate offset values determined in a first exposure mode.

FIG. 7A shows in a diagram the profile of the first positioning error 58 of the first pattern 46 of the first structure elements 48 as a function of the position y along the exposure slit of the projection apparatus 5. This profile is determined, for example, by a simulation, as described above. It is assumed for the simulation that a halftone phase mask is used as reticle 18 and the light source 16 performs a so-called dipole exposure.

As shown in FIG. 7A, the first positioning error 58 exhibits a change by more than 6 nm, for example, at a position that deviates by approximately 5 mm from the midpoint of the exposure slit.

Figure 7B:
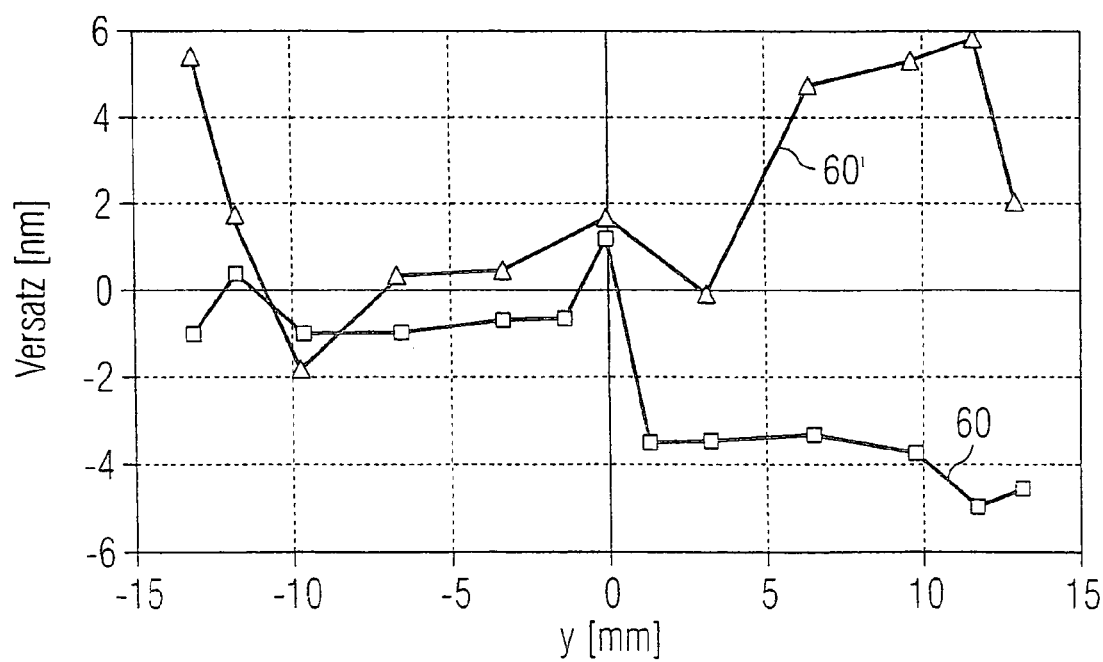

FIG. 7B shows the second positioning error 60 for the measurement mark 42 as a function of the position of the exposure slit of projection apparatuses. A nonlinear profile of the second positioning error 60 can be discerned in this case.

Figure 8A:
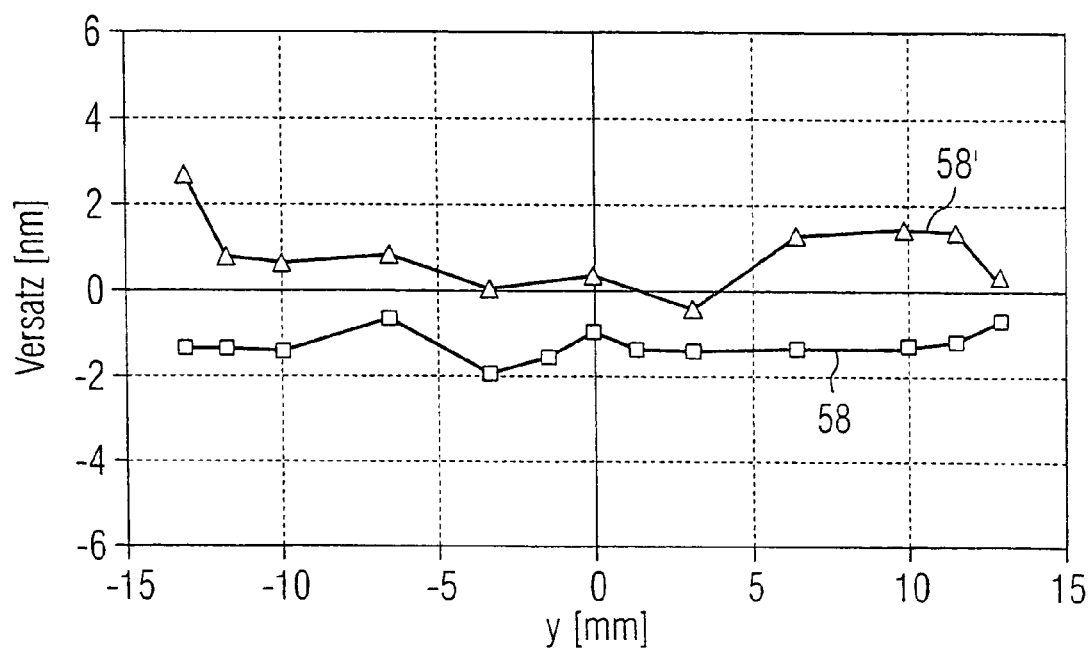
FIGS. 8A and 8B diagrammatically illustrate offset values determined in a second exposure mode.
Figure 8B:
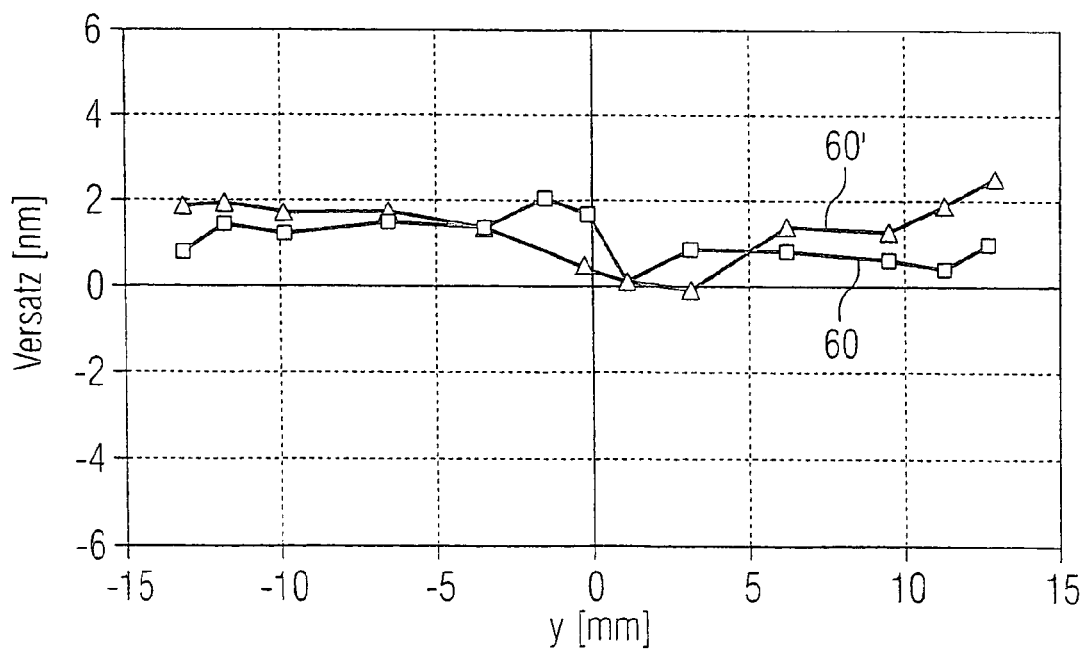

The profile of the positioning errors of the structure elements and of the overlay targets changes with different exposure conditions, as is shown in connection with FIGS. 8A and 8B. FIGS. 8A and 8B show the first positioning error 58 and the second positioning error 60 for an annular exposure using a halftone phase mask. It can be seen that the profile of the positioning errors is different from those of the dipole exposure in accordance with FIGS. 7A and 7B.

As explained above in connection with FIG. 6, the positioning error is previously corrected using a linear function $$F(y)=a+b*y.$$

The linear function is adapted to the profile of the positioning errors along the position y of the exposure slit in order to determine the free parameters, the gradient b and the constant term a. The two parameters are returned as intra-field errors to the exposure apparatus in the context of the APC loop. The first parameter corresponds to the field magnification error and the second parameter corresponds to the translation error of the overlay model.

Figure 9:
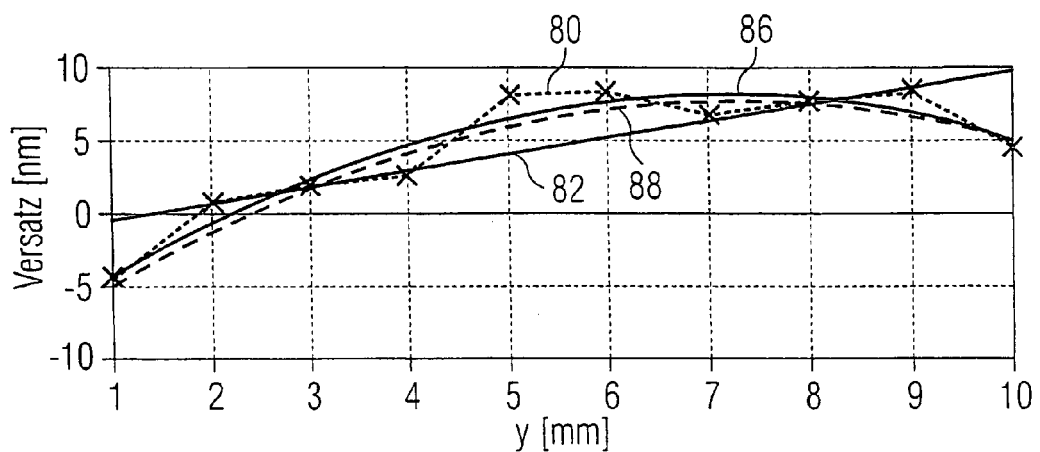
FIG. 9 diagrammatically illustrate measured offset values and functions adapted thereto in accordance with a further aspect of the invention.

FIGS. 7A and 7B show that the value of the positioning error for the first structure elements and the overlay targets varies continuously along the exposure slit. However, a correction effected based on a linear function leads to non-correctable positioning errors. In order to minimize the overlay error 54, a nonlinear correction of the first positioning error 58 of the first structure elements 48 along the exposure slit is hereinafter performed. This is explained in more detail in connection with FIG. 9. FIG. 9 shows the profile of the first positioning error 58 as data points along the exposure slit. The first positioning error 58 is specified relative to an ideal position in FIG. 9. The ideal position may be effected, for example, based on a calculation, as specified above, or a measurement. However, the position of an already patterned preliminary layer to be optimized with regard to its overlay with respect to the layer currently being projected may also be considered for the ideal position.

In FIG. 9, the measurement points are connected by a broken line 80. A linear correction function 82 determined by an adaptation to the data values is depicted for comparison. It can be seen that only a limited accuracy can be achieved in the adaptation by a linear function.

Figure 10:
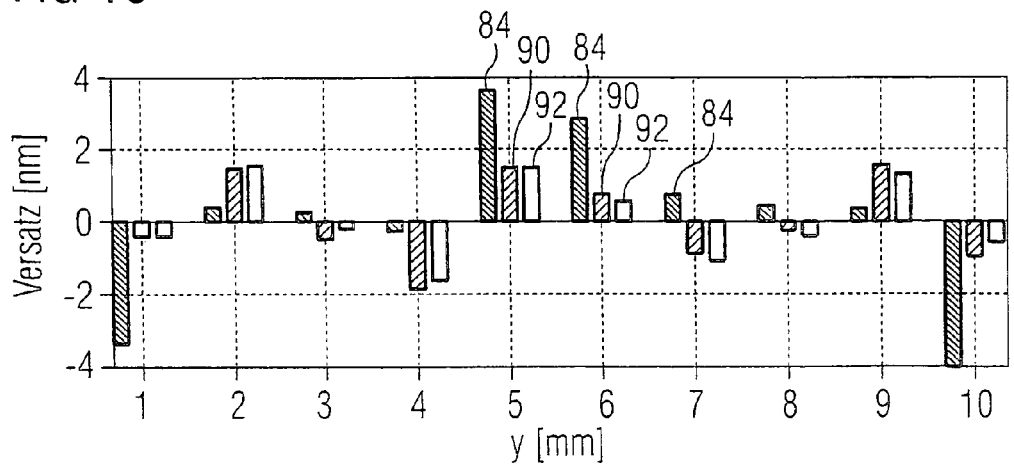
FIG. 10 diagrammatically illustrates deviations of the measured offset values and the functions adapted thereto in accordance with the further aspect of the invention.

This is illustrated once again in FIG. 10, which specifies the difference 84 between the data points and the value of the linear function as a function of the position along the exposure slit. It follows from FIG. 10 that large deviations result in particular at the edge and in the center of the exposure slit.

In comparison with this, FIG. 9 shows a second-order polynomial 86 and a third-order polynomial 88. The second-order polynomial is represented by the relationship $$F(y)=a+b*y+c*y^2$$

and the third-order polynomial is correspondingly represented by $$F(y)=a+b*y+c*y^2+d*y^3.$$

Both polynomials are hereinafter adapted to the profile of the data points. Both curves reproduce the profile of the data points relatively better. This can be seen, in particular, in FIG. 10, since the difference values (90) between the second-order polynomial and the difference values (92) between the third-order polynomial and the data points are relatively significantly smaller.

The coefficients a and b of the second-order polynomial and of the third-order polynomial may again be assigned directly to the correction parameters of the overlay model (translation and field magnification errors of the intra-field correction).

The higher-order terms, i.e., the coefficient c in the case of the second-order polynomial and c and d in the case of the third-order polynomial, are used as correction values for the control of the corresponding lens elements of the correction lenses 19, 21. For this purpose, the coefficients are assigned to a distortion described by corresponding Zernike coefficients. The degree and extent of the correction of a corresponding movable lens element 19 or 21 are determined based on the lens model. In this way, it is possible to carry out nonlinear corrections along the exposure slit with the aid of the lens elements 19, 21.

In accordance with this procedure, it is possible to achieve a significant improvement of the positioning errors induced by aberration errors on the basis of the nonlinear corrections. As a result of these nonlinear corrections which can be performed by the lens elements 19, 21, the first positioning error 58 is minimized in comparison with the ideal position.

However, an alteration of the lens elements 19, 21 may also bring about an alteration of the imaging properties of the projection apparatus 5, so that the improvement of the aberration errors and the possible impairment of the imaging properties have to be balanced.

The above example discussed the possibility of using the movable lens elements 19, 21 for improving the correction of the aberration errors. However, it is also conceivable to obtain an adaptation between different exposure apparatuses 5 by the movable lens elements 19, 21, as is explained below.

In high-volume process lines of DRAM fabrication, different exposure apparatuses are often used for lithographic patterning of identical layers in order to obtain a highest possible throughput of the fabrication installation. Since the aberration error constitutes an individual property of the lens (or lens system) of the projection objective 20, different aberration errors are also to be expected for different exposure apparatuses.

FIGS. 7A, 7B, 8A, and 8B each illustrate a further first positioning error 58' and a further second positioning error 60' which occur when another exposure apparatus is used. A different profile of the positioning errors along the exposure slit results for different exposure apparatuses, as shown in the corresponding figures. When different exposure apparatuses are used, each exposure apparatus has available a set of movable lens elements 19, 21, which, analogously to the above explanations, can be adapted such that the overlay of two subsequently patterned layers is improved.

To summarize, a plurality of implementations can achieve a correction of the positioning errors brought about by aberration of the projection objective by not only evaluating the overlay targets, as has been customary heretofore, but also accounting for the structure-size-dependent positioning errors of the circuit pattern. It is possible to improve the overlay of different layers in the production of integrated circuits, thereby achieving an improvement of the number of functional circuits.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

| List of reference symbols | |
|---|---|
| 5 | Projection apparatus |
| 10 | Semiconductor wafer |
| 12 | Substrate holder |
| 14 | Resist layer |
| 14' | Resist structure |
| 16 | Light source |
| 18 | Reticle |
| 20 | Projection objective |
| 22 | Overlay measuring apparatus |
| 24 | Further substrate holder |
| 26 | Further light source |
| 28 | Microscope |
| 30 | Processing means |
| 40 | Exposure field |
| 42 | Overlay target |
| 44 | First measurement mark |
| 46 | First pattern |
| 48 | First structure elements |
| 50 | Sawing frame |
| 52 | Offset value |
| 54 | Overlay error |
| 56 | Relative positioning error |
| 58 | First positioning error |
| 60 | Second positioning error |
| 62 | Difference between first and second positioning error |
| 64 | Third positioning error |
| 66 | Fourth positioning error |
| 68 | First linear function |
| 70 | Second linear function |
| 72 | Difference between first and third positioning error |
| 74 | Curve |
| 76 | Further curve |
| 80 | Data points |
| 82 | Linear function |
| 86 | Second-order polynomial |
| 88 | Third-order polynomial |
| 84, 90, 92 | Deviation |

What is claimed is:

1. A method for the correction of structure size dependent positioning errors during the photolithographic projection by an exposure apparatus, the method comprising:
   providing an exposure apparatus for performing an exposure in a plurality of exposure fields;
   providing a simulation model of the exposure apparatus with a calculation specification for specifying correction values for intra-field errors during the exposure;
   providing a first pattern including a plurality of first structure elements and a plurality of first measurement marks;
   photolithographically projecting the first pattern by the exposure apparatus into the exposure fields, different positioning errors being brought about for the first structure elements and first measurement marks due to different dimensions as a result of aberration, the first structure elements being beset by a first positioning error depending on the dimensions of the first structure elements and the position of the first structure elements in the exposure field, the first measurement marks being beset by a second positioning error depending on the dimensions of the first measurement marks and the position of the first measurement marks in the exposure field;
   providing a correction function for specifying the first positioning error and the second positioning error;
   determining an average relative positioning error from the first positioning error and the second positioning error;
   calculating correction values for the control of the exposure apparatus based on the first positioning error and the second positioning error by the simulation model; and
   transmitting the correction values as an intra-field correction to the exposure apparatus so that subsequent exposures are performed with an improved overlay.

2. The method as claimed in claim 1, wherein providing the first pattern includes the first structure elements having minimal dimensions of 100 nm or less.

3. The method as claimed in claim 1, wherein providing the first pattern includes the first measurement marks having minimal dimensions of between 0.5 μm and 5 μm and forming the first part of an overlay target.

4. The method as claimed in claim 3, wherein providing the first pattern includes the first measurement marks having the form of a frame with an external dimension of approximately 50 μm and a line width of approximately 2 μm.

5. The method as claimed in claim 1, wherein providing the first pattern comprises:
   providing a sawing frame surrounding the first pattern; and
   providing the plurality of first measurement marks arranged such that a respective first measurement mark lies in the region of each corner of the sawing frame.

6. The method as claimed in claim 5, wherein providing the first pattern further includes
   providing the plurality of first measurement marks arranged such that at least one first measurement mark lies in the region of the midpoint of the exposure field.

7. The method as claimed in claim 1, wherein providing the correction function includes
   providing a test substrate with a resist layer on the front side;
   providing a first test mask with a first test pattern having a first multiple arrangement of a first test structure, the first test structure including the first pattern, the plurality of first measurement marks, and at least one first micro-patterned alignment mark;
   transferring the first test pattern by photolithographic projection into the resist layer of the test substrate; and
   determining the values of the first positioning error of the first pattern relative to the at least one first measurement mark and the at least one first micro-patterned alignment mark for each element of the first multiple arrangement.

8. The method as claimed in claim 7, wherein the exposure apparatus is a wafer scanner.

9. The method as claimed in claim 8, wherein the multiple arrangement of the first test structure is arranged in column-type fashion, so that when the test structure is transferred into the resist layer of the test substrate by the wafer scanner, the first positioning errors and the second positioning errors and the relative positioning errors of the test structure are determined along an exposure slit of the wafer scanner.

10. The method as claimed in claim 7, wherein the exposure apparatus is a wafer stepper.

11. The method as claimed in claim 10, wherein the multiple arrangement of the first test structure is arranged in matrix-type fashion, so that when the test structure is transferred into the resist layer of the test substrate by the wafer stepper, the first positioning errors and the second positioning errors of the test structure are determined in the imaging region of the wafer stepper.

12. The method as claimed in claim 7, wherein the first micro-patterned alignment mark is formed with a plurality of microstructure elements, so that patterning of the first micro-patterned alignment mark corresponds to patterning of the first structure elements of the first pattern.

13. The method as claimed in claim 1, wherein providing the correction function includes
providing a model of the photolithographic projection by the exposure apparatus for specifying the first positioning error and the second positioning error for a plurality of positions within the exposure field.

14. The method as claimed in claim 13, wherein the model of the photolithographic projection by the exposure apparatus is generated via a simulator.

15. The method as claimed in claim 9, wherein determining the average relative positioning error includes determining the difference between the first positioning error and the second positioning error for a plurality of positions within the exposure field, the differences subsequently being averaged.

16. The method as claimed in claim 15, wherein determining the average relative positioning error includes forming the difference between the first positioning error and the second positioning error along the exposure slit.

17. The method as claimed in claim 1, further comprising:
providing a second pattern including a plurality of second structure elements and a plurality of second measurement marks for forming a respective overlay target with one of the first measurement marks of the first pattern,
photolithographically projecting the second pattern by the exposure apparatus into the exposure fields, different positioning errors being brought about for the second structure elements and second measurement marks due to different dimensions as a result of aberration, the second structure elements being beset by a third positioning error depending on the dimensions of the second structure elements and the position of the second structure elements in the exposure field, the second measurement marks being beset by a fourth positioning error depending on the dimensions of the second measurement marks and the position of the second measurement marks in the exposure field; and
determining offset values of the overlay targets, the offset value being composed of an overlay error, the second positioning error, and the fourth positioning error.

18. The method as claimed in claim 17, wherein providing the second pattern includes the second structure elements having minimal dimensions of 100 nm or less.

19. The method as claimed in claim 17, wherein providing the second pattern includes the second measurement marks having minimal dimensions of between 0.5 µm and 5 µm.

20. The method as claimed in claim 19, wherein providing the second pattern includes the second measurement marks having the form of a frame with an external dimension of approximately 50 µm and a line width of approximately 2 µm.

21. The method as claimed in claim 17, wherein providing the second pattern includes:
providing a further sawing frame surrounding the second pattern; and
providing the second measurement marks arranged such that a respective second measurement mark lies in the region of the corner of the further sawing frame and/or a second measurement mark lies in the region of the midpoint of the further sawing frame.

22. The method as claimed in claim 17, wherein providing the correction function includes the correction function specifying the third positioning error and the fourth positioning error.

23. The method as claimed in claim 17, wherein determining the offset value of the overlay target includes
providing the first positioning errors as a function of the position on the exposure field;
providing the third positioning errors as a function of the position on the exposure field;
determining the difference between the first positioning error and the third positioning error as a function of the position on the exposure field;
determining a first linear function that represents the first positioning error as a function of the position on the exposure field;
determining a second linear function representing the third positioning error as a function of the position on the exposure field; and
determining further parameters for the simulation model, the further parameters selected based on the first linear function and the second linear function such that the difference between the first positioning error and the third positioning error as a function of the position on the exposure field becomes minimal.

24. The method as claimed in claim 23, wherein determining the offset value of the overlay target further includes the further parameters being allocated to a first contribution representing a further translation error, and a second contribution representing a further field rotation error, in a first direction and a second direction.

25. The method as claimed in claim 23, wherein determining further parameters for the simulation model furthermore includes transmitting the further parameters to the exposure apparatus to be implemented in subsequent exposures with an improved overlay.

26. A method for the correction of structure size dependent positioning errors during the photolithographic projection by an exposure apparatus, comprising:
providing an exposure apparatus for performing an exposure in a plurality of exposure fields, a plurality of first structure elements being beset by a first positioning error depending on dimensions of the first structure elements and the position of the first structure elements in the exposure field;
providing at least one movable lens element in the projection objective of the exposure apparatus to correct imaging properties of the exposure apparatus;
providing a simulation model of the exposure apparatus with a calculation specification for specifying correction values for intra-field errors during the exposure;
providing a first pattern including the plurality of first structure elements,
providing a correction function for specifying the first positioning error;
providing an at least second-order polynomial including a plurality of parameters;

adapting the parameters of the polynomial to represent the first positioning error as a function of the position on the exposure field;

calculating first correction values for the control of the exposure apparatus based on parameters characterizing a linear portion of the polynomial by the simulation model;

calculating at least a second correction value for the control of the exposure apparatus based on parameters characterizing a nonlinear portion of the polynomial by the simulation model;

transmitting the first correction values to the exposure apparatus; and transmitting the second correction value to the at least one movable lens element of the exposure apparatus so that subsequent exposures are performed with an improved overlay.

27. The method as claimed in claim 26, wherein providing the first pattern includes the first structure elements having minimal dimensions of 100 nm or less.

28. The method as claimed in claim 26, wherein providing the correction function includes:

providing a model of the photolithographic projection by the exposure apparatus for specifying the first positioning error and the second positioning error for a multiplicity of positions within the exposure field.

29. The method as claimed in claim 26, wherein providing the correction function includes:

providing a test substrate with a resist layer on the front side;

providing a first test mask with a first test pattern having a first multiple arrangement of a first test structure, the first test structure including the first pattern, the plurality of first measurement marks, and at least one first micro-patterned alignment mark;

transferring the first test pattern by photolithographic projection into the resist layer of the test substrate; and determining the values of the first positioning error of the first pattern relative to the at least one first measurement mark and the at least one first micro-patterned alignment mark for each element of the first multiple arrangement.

30. The method as claimed in claim 29, wherein the exposure apparatus is a wafer scanner.

31. The method as claimed in claim 30, wherein the multiple arrangement of the first test structure is arranged in column-type fashion, so that when the test structure is transferred into the resist layer of the test substrate by the wafer scanner, the first positioning errors are determined along an exposure slit of the wafer scanner.

32. The method as claimed in claim 29, wherein the exposure apparatus is a wafer stepper.

33. The method as claimed in claim 32, wherein the multiple arrangement of the first test structure is arranged in matrix-type fashion, so that when the test structure is transferred into the resist layer of the test substrate by the wafer stepper, the first positioning errors of the test structure are determined in the imaging region of the wafer stepper.

34. The method as claimed in claim 29, wherein the first micro-patterned alignment mark is formed with a plurality of microstructure elements, so that the patterning of the first micro-patterned alignment mark corresponds to the patterning of the first structure elements of the first pattern.

35. The method as claimed in claim 26, wherein providing the polynomial includes providing a second- or higher-order polynomial, the parameters characterizing a linear portion of the polynomial being derived from a constant term and a linear term.

36. The method as claimed in claim 35, wherein providing the polynomial includes the parameter characterizing a nonlinear portion of the polynomial is derived from a quadratic or higher term.

37. The method as claimed in claim 26, wherein providing the polynomial includes providing a third-order polynomial.

38. The method as claimed in claim 26, wherein transmitting the second correction values is followed by carrying out a photolithographic projection of the first pattern by the exposure apparatus into the exposure fields.

39. The method as claimed in claim 17, wherein the plurality of exposure fields are disposed on a semiconductor wafer, the method further comprising:

providing the semiconductor wafer;

transferring the first pattern by the exposure apparatus by photolithographic projection into a first layer of the semiconductor wafer; and transferring the second pattern by the exposure apparatus by photolithographic projection into a second layer of the semiconductor wafer.

40. The method as claimed in claim 26, wherein the plurality of exposure fields are disposed on a semiconductor wafer, the method further comprising:

providing the semiconductor wafer;

transferring the first pattern by the exposure apparatus by photolithographic projection into a first layer of the semiconductor wafer.

* * * * *